United States Patent [19]

Inoue et al.

[11] Patent Number: 4,917,965
[45] Date of Patent: Apr. 17, 1990

[54] MULTIFILAMENT NB₃AL SUPERCONDUCTING LINEAR COMPOSITE ARTICLES

[75] Inventors: Kiyoshi Inoue; Takao Takeuchi; Yasuo Iijima; Michio Kosuge, all of Tsukuba, Japan

[73] Assignee: National Research Institute for Metals, Tokyo, Japan

[21] Appl. No.: 315,825

[22] Filed: Feb. 24, 1989

Related U.S. Application Data

[63] Continuation-in-part of Ser. No. 235,539, Aug. 24, 1988, abandoned.

[30] Foreign Application Priority Data

Aug. 25, 1987 [JP] Japan .................................. 62-209150
Mar. 14, 1988 [JP] Japan .................................... 63-60080
Aug. 12, 1988 [JP] Japan .................................. 63-200238

[51] Int. Cl.⁴ .......................................... H01B 12/00
[52] U.S. Cl. ................................. 428/614; 428/930; 505/813
[58] Field of Search ......................... 428/614, 930; 148/11.5 F, 11.5 Q, 133

[56] References Cited

U.S. PATENT DOCUMENTS

3,815,224  6/1974  Pickus et al. ........................ 428/930
4,223,434  9/1988  Wong et al. ....................... 148/11.5 F
4,791,241 12/1988  Ando et al. .......................... 428/930

*Primary Examiner*—L. Dewayne Rutledge
*Assistant Examiner*—David W. Schumaker
*Attorney, Agent, or Firm*—Fitzpatrick, Cella, Harper & Scinto

[57] ABSTRACT

A long, linear composite article which is characterized in that a large number of composite filaments are present as spaced from one another in a continuous layer composed of copper, a copper alloy, niobium, tantalum or vanadium, each of said composite filaments having a structure that at least one strand of a linear body is surrounded by an aluminum alloy or niobium, said linear body being composed substantially of extremely fine, filamentary superconducting $Nb_3Al$ compound having an average diameter of from about 0.03 μm to about 1 μm. The said composite article can be prepared by drawing a composite material composed of (a) an aluminum alloy and (b) niobium, together with copper or a copper alloy once or plural times repeatedly, until the average diameter of the aluminum alloy of (a) becomes about 1 μm or less, and heat-treating the resultant linear composite material. This composite articles exhibit excellent superconducting characteristics in high-magnetic field and alternating-current magnetic field.

18 Claims, 1 Drawing Sheet

MULTIFILAMENT NB$_3$AL SUPERCONDUCTING LINEAR COMPOSITE ARTICLES

This application is a continuation-in-part application of Ser. No. 235,539 filed on Aug. 24, 1988, now abandoned.

[TECHNICAL FIELD]

This invention relates to superconducting linear composite articles and processes for their preparation. More particularly, the invention relates to linear composite articles containing Nb$_3$Al as the superconducting material and processes for their preparation, inter alia, to linear composite articles exhibiting excellent superconducting characteristics in high-magnetic field and alternating-current magnetic field.

[TECHNICAL BACKGROUND]

Superconducting linear composite articles for high-magnetic field using Nb$_3$Sn and V$_3$Ga as linear superconducting material have been used heretofore. Also as a superconducting material for alternating current, Nb-Ti superconducting, multifilamentary wire is being put to practical use. See, for example, *Superconductor Materials Science, Metallurgy, Fabrication and Application* (NATO ADVANCED STUDY INSTITUTES SERIES, Series B: Physics) edited by Simon Foner and Brian B. Schwartz, Chapter 2, "Practical superconducting materials", pp. 63–67.

The composite articles containing Nb$_3$Sn and V$_3$Ga as linear superconducting material are manufactured by a process comprising drawing a composite composed of a copper alloy (Cu-Sn alloy or Cu-Ga alloy) and Nb or V, while effecting an intermediate annealing in vacuum at temperatures ranging 500–600° C., repeating this processing several tens times and there after subjecting the product to a heat-treatment for diffusion reaction.

During the drawing, oxygen-free copper is compounded into the linear material for stabilization, but it necessitates insertion of tantalum foil, niobium foil, etc. into interspaces among the linear materials as diffusion barriar, in order to avoid diffusion reaction between the oxygen-free copper and the copper alloy.

Therefore, the production process of heretofore known Nb$_3$Sn- and V$_3$Ga-containing linear composite articles as above described involves very cumbersome fabrication steps and reduction in their production cost is difficult. Still more, upper critical magnetic field of whereby obtained Nb$_3$Sn- and V$_3$Ga containing superconducting material is only about 20T, and their ability to provide high-magnetic field is limited.

On the other hand, first practical ultra-fine multifilamentary composite wire showing extremely little alternating-current loss was provided by the use of Nb-Ti alloy. However, the critical temperature of this Nb-Ti alloy is 9K, and when it is used in liquid helium (4.2K), the temperature margin is only 4.8K. Linear composite articles of such a small temperature margin are not very advantageous for the use as superconducting magnet for alternating current, because a constant amount of heat generation is always occurred in the magnet during operation, and at temperatures close to, or exceeding, the critical temperature, the magnet performance is deteriorated or stopped.

On the other hand, Nb$_3$Al compound is known to have critical temperatures (Tc) ranging 15–19K, upper critical magnetic field of 30T, aforesaid temperature margin of at least 10 K and superior superconducting characteristics to either of the aforesaid Nb$_3$Sn-V$_3$Ga composite articles or the Nb-Ti alloy ultra-fine multifilamentary wire.

However, Nb$_3$Al compound had a serious drawback for its practical use, that it was very difficult to make it a linear material, particularly a ultra-fine gauge, homogeneous linear material. That is, it has been reported as a result of laboratory level experiments of compressing to solid a powdery mixture of Nb and Al, drawing the solid and heat-treating the same, that the resultant relatively short, linear composite article manifested excellent superconducting characteristics as above-described. However, it is extremely difficult to form long, filamentary product, particularly long, ultra-fine and homogeneous filamentary product, from this Nb$_3$Al compound, and for this reason it has not yet been commercialized.

The foregoing facts are taught in the following references:

(i) *Advances in Cryogenic Engineering*, Vol. 34, "Materials" Pages 461–468.
(ii) *IEEE Transactions on Magnetics*, Vol. Mag-21, No. 2, pages 756–759 (1985).
(iii) *IEEE Transactions on Magnetics*, Vol. Mag-23, No. 2, pages 653–656 (1987).

One of the causes why the linear body of the Nb$_3$Al compound test-manufactured by the powder process on laboratory level as above has not been commercialized in spite of its excellent superconducting property lies in the extreme difficulties of preventing oxidation of Nb and Al powders serving as the starting material and of controlling their particle sizes.

On the other hand, manufacture of linear bodies of Nb$_3$Al compound through the steps of forming filaments or thin films of Nb and pure Al, compounding them, cold-drawing the composite material and heat-treating the same was also attempted. Because of the lower hardness of pure Al than that of Nb, however, Al shows abnormal deformation during the drawing, causing sometimes breakage of the linear body. Consequently fine and homogeneous filamentary product cannot be obtained, and hence the process has not been commercialized.

[OBJECTS OF THE PRESENT INVENTION]

Accordingly, an object of the present invention is to provide extremely fine, linear composite articles of Nb$_3$Al compound.

Another object of the present invention is to provide industrially useful, extremely fine and homogeneous linear composite articles of Nb$_3$Al which exhibit excellent superconducting characteristics.

Still another object of the present invention is to provide linear composite articles suited for usages as the materials of alternating-current superconducting devices, for example, superconducting transformer and superconducting generator exhibiting little alternating-current loss, excellent mechanical strength and high resistance to flexural strain.

An additional object of the present invention is to provide a practical and economical process for making ultrafine, linear composite articles of Nb3Al compounds through relatively easy production process at reduced production cost.

Other objects and advantages of the present invention will become apparent from reading the following descriptions.

[CONSTRUCTION OF THE INVENTION]

According to our studies, it has been found that the above enumerated objects and advantages of the present invention can be accomplished by a long, linear composite article which is characterized in that a large number of composite filaments are present as spaced from one another in a continuous layer composed of copper, a copper alloy, niobium, tantalum or vanadium each of said composite filaments having a structure that at least one strand of a linear body is surrounded by an aluminum alloy or niobium, said linear body being composed substantially of extremely fine, filamentary superconducting $Nb_3Al$ compound having an average diameter of from about $0.03\mu m$ to about $1\mu m$.

According to the present invention as above, a long, linear composite article in which a large number of ultra-fine filamentary $Nb_3Al$ of an average diameter of from about $0.03\mu m$ to about $1\mu m$ are present, is provided, which serves as a member for superconducting devices of excellent superconducting characteristics and high industrial value. Particularly, the linear composite article of the present invention exhibits a durability to tensile strain at least about three times greater than those of conventional superconducting composite articles, which not only facilitates its incorporation into superconducting devices, but also the incorporated linear article advantageously possesses a high mechanical strength.

Furthermore, the production process of the long, linear composite article of the present invention are relatively simple as is apparent from the later given explanation, and does not require use of such members as tantalum or niobium foil which are expensive and cumbersome of handling. Thus the economical merit of the present invention is indeed great.

Hereinafter the long, linear composite article and the production process thereof of the present invention will be explained in further details.

In the long, linear composite article of the invention a large number of filamentary $Nb_3Al$ compound are present along its lengthwise direction. The average diameter of the filamentary $Nb_3Al$ compound ranges from about $0.03\mu m$ to about $0.1\mu m$, preferably from about $0.05\mu m$ to about $0.5\mu m$. The $Nb_3Al$ compound is characterized by its extreme fineness and high homogeneity. The "diameter" herein refers to the diameter of the hypothetical circle of the area occupied by single strand of filamentary $Nb_3Al$ compound in the cross section of the linear composite article of the invention cut at a perpendicular to the lengthwise direction of the article. Therefore the term, "average diameter", means the arithmetic mean of the diameters of the large number of filamentary $Nb_3Al$ compound present in said cross section.

The configuration of the cross section of the filamentary $Nb_3Al$ compound is not critical, which may be circular, elliptical, rectangular or triangular, while circular or elliptical configurations are generally preferred.

Figure 1A:
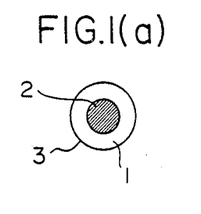
Figure 1B:
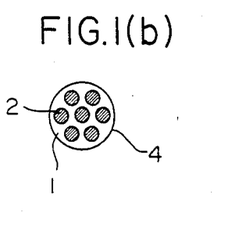

The above filamentary $Nb_3Al$ compound of the invention is surrounded by an aluminum alloy or niobium. That is, the cross section has an appearance as illustrated in (a) or (b), particularly the latter, of FIG. 1, in which 1 denotes $Nb_3Al$ compound and 2 denotes the aluminum alloy or niobium, together forming the composite filament.

In such a composite filament, the aluminum alloy preferably contains at least one metal selected from the group consisting of Cu, Mg, Zn, Li and Ag, more preferably at a proportion of not exceeding 15 atomic percent of such other metal or metals. The most preferred aluminum alloy contains from about 0.1 to about 15 atomic percent, preferably from about 2 to about 15 atomic percent, inter alia, from about 3 to about 10 atomic percent of at least one metal selected from the group consisting of Mg, Zn, Li and Ag, or an aluminumcopper alloy containing from about 0.5 to about 3 atomic percent, preferably from about 1 to about 2 atomic percent, of Cu.

The aluminum alloy or niobium may further contain up to about 4 atomic percent of Si and/or Ge. When such additional component or components are contained, the composite article of improved critical temperature (Tc) and critical current density (Jc) can be obtained.

Figure 2A:
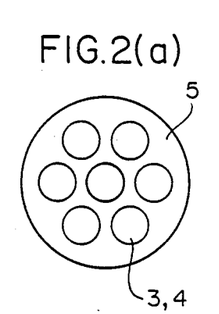
Figure 2B:
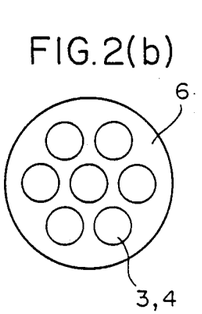
Figure 2C:
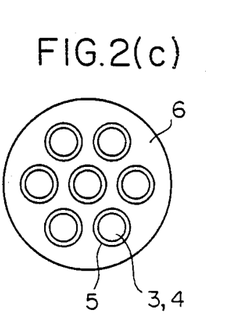

In the linear composite article of the present invention, a large number of the composite filaments having the structure that at least one strand of the filamentary $Nb_3Al$ compound is surrounded by an aluminum alloy or niobium, are present as spaced from one another in a continuous layer composed of copper, a copper alloy, niobium, tantalum or vanadium. Cross sections of the composite article of the invention may be diagrammatically illustrated as in (a), (b) or (c) of FIG. 2, in which the numbers 3 and 4 denote the cross sections of the composite filament, and 5 and 6 denote the copper-, copper alloy-, niobium-, tantalum- or vanadium- continuous layer.

In the linear composite article of the present invention, advantageously a large number of said composite filaments are parallelly present along the lengthwise direction of the article, in mutually spaced relationship, preferably without contact with one another at any place, more preferably at equally spaced relationship with one another.

For a large number of the composite filaments to be present in the linear composite article of the present invention at mutually spaced relationship, it is necessary for copper, a copper alloy, niobium, tantalum or vanadium to form a continuous layer. Copper or a copper alloy is preferred as a continuous layer material. As such copper or a copper alloy, oxygen-free copper, cupro-nickel and coppermanganese alloy may be named, among which oxygen-free copper and cupro-nickel are preferred.

The configuration of the transverse cross section to the lengthwise direction of the composite filament is not critical, which may be circular, elliptical, rectangular or triangular, for example, generally those of circular or elliptical cross sections being preferred.

The linear composite article according to the present invention contains therein at least about 100,000, preferably from about 100,000 to about 100,000,000, strands of said composite filaments for better utility. Again, it is more practical for the linear composite article to have an average diameter of generally from about 0.2mm to about 5mm, particularly from about 0.3mm to about 4mm.

Needless to say, the number of the composite filaments to be contained in the linear composite article of the present invention and the average diameter of the article are not limited to the afore-specified ranges, but may be varied depending on, eg. the individual purpose of use of the linear composite article, and type and size of the devices for which it is used.

Now the production process of the linear composite article of the present invention will be explained.

The process of the present invention is characterized in that, in order to form the aforesaid extremely fine and homogeneous filamentary $Nb_3Al$ compound, an aluminum alloy and niobium are used as the basic materials. According to the basic process of the invention, the composite material composed of an aluminum alloy and niobium, particularly a single-core type linear composite material in which either one of the two components forms the core and the other surrounds the core, is used as the starting material, which is drawn until the thickness (diameter if the material is wire-formed) of the aluminum alloy is reduced to not greater than $1\mu m$ and thereafter heat-treated at high temperatures.

In the above-described process of the invention, the use of an aluminum alloy in place of the heretofore known pure aluminum made it possible to form the extremely fine and homogeneous filamentary $Nb_3Al$ compound and to obtain the linear composite article exhibiting high resistance to tensile strain.

As the aluminum alloys useful for the process of the present invention, those having hardness which is higher than that of pure aluminum and relatively close to that of niobium are suited. As such aluminum alloy, those composed of aluminum and at least one metal selected from the group consisting of Cu, Mg, Zn, Li and Ag are preferred. Particularly, such aluminum alloys containing not more than about 15 at% of such other metal or metals are preferred. Here "at %" means atomic percent, viz., a percentile value of atomic ratio of each of the metal to the total metals composing the alloy.

Particularly advantageous aluminum alloys are those containing from about 0.1 to about 15 at%, preferably from about 2 to about 15 at%, especially preferably from about 3 to about 10 at%, of at least one metal selected from the group consisting of Mg, Zn, Li and Ag, or those containing from about 0.5 to about 3 at%, more preferably from about 1 to about 2 at%, of Cu.

The aluminum alloy may contain only one of aforesaid metals or more than one of those metals. Examples of possible combination in the alloys include Cu-Al, Mg-Al, Zn-Al, Li-Al, A-Al, Cu-Mg-Al, Cu-Mg-Li-Al, Cu-Mg-Li-Ag-Al, Mg-Li-Al and Zn-Ag-Al. There is no critical limitation about the combination of elements.

These combinations and respective amount of addition of each component are selected to obtain aluminum alloys of the hardness and hardening rate under cold-working approximately same to those of Nb, and within the range not deleterious to the superconducting characteristics of the filamentary $Nb_3Al$ compound.

It is also possible to subject the aluminum alloy, before compounding the same with niobium, to a solution treatment, quenching and tempering to increase the hardness of the aluminum alloy. By effecting those treatments, the amount of other metal or metals to be added to the aluminum alloy can be reduced.

Hereinafter the process of the invention will be explained referring to the drawings.

[BRIEF EXPLANATION OF DRAWINGS].

FIG. 1 (a) and (b) are the cross sections showing examples of Nb-Al alloy composite, round rods used in the production process of this invention.

FIG. 2 (a), (b) and (c) are the cross sections of composite filament in which plural strands of the composite filaments are present as spaced from one another in a continuous layer composed of, respectively, oxygen-free copper, cupro-nickel, and both of the two.

FIG. 3 (a), (b) and (c) are the cross sections each illustrating a different embodiment of the composite article.

In those drawings, the numerals denotes respectively the following:

1 Nb
2 an aluminum alloy
3 and 4 the composite filaments
5 oxygen-free copper
6 cupro-nickel
7 a sintered body of Nb powder The outline of the present process will be explained hereinbelow.

As shown in FIG. 1 (a) and (b), first composite materials (3) and (4) composed of Nb (1) and an aluminum alloy (2) are prepared. Those materials are cold-drawn until the thickness (diameter) of the aluminum alloy (2) is reduced to not greater than, $1\mu m$. Then the drawn composite materials (3) and (4) are heat-treated at high temperatures of, for example, about 700° C. — about 2,300° C. Whereby the filamentary $Nb_3Al$ superconducting material of the thickness (diameter) not exceeding about $1\mu m$ having excellent high magnetic field and alternatingcurrent properties is prepared.

Referring to FIG. 1 (a) and (b), the composition of Nb and the aluminum alloy may be reversed. That is, composite materials (3) and (4) may be such that (1) is an aluminum alloy and (2) is niobium. It is preferred however to start from the composite material in which (1) is niobium and (2) is an aluminum alloy.

More specifically, first into a Nb pipe (1), one or more rods of an Al alloy (2) having approximately the same degree of hardening rate under processing to that of Nb are inserted, and together subjected to an extrusion, cold-drawing or the like to be extended into a long, round rod of the composite material (3) or (4).

The linearization by cold-drawing may be effected with composite round rod of multiple-layered structure formed by inserting the composite material (3) or (4) into a pipe of oxygen-free copper (5) or cupro nickel (6) or of both of those two, as illustrated in FIG. 2 (a), (b) and (c), as a stabilizing material (a material of low electrical resistance necessary for a large capacity conductor) or as a coupled current intercepting material (a material of high electrical resistance, necessary for alternating-current conductor). While (5) and (6) are explained as being respectively oxygen-free copper and cupro nickel to simplify the explanation, either one of these may be copper-manganese alloy, niobium, tantalum or vanadium with equal effect.

Also as aforesaid, in FIG. 1 (a) and (b), (1) may be an aluminum alloy and (2) may be niobium. When niobium forms the filamentary body and the aluminum alloy, the continuous layer, in a composite material composed of an aluminum alloy and niobium as above, the circumference of the composite material should be coated with niobium, tantalum, vanadium, or a mixture thereof, and as a whole used as the composite filaments of (3) and (4) of FIG. 2. When such a coating is omitted and the aluminum alloy is exposed uncoated, it comes to direct contact with oxygen-free copper, cupro nickel or copper-manganese alloy, to cause a diffusion reaction of aluminum and copper during the later described heat-treating step.

Oxygen-free copper, cupro nickel, copper-manganese alloy, niobium, tantalum or vanadium as a continuous layer of (5) and (6) in FIG. 2 not only have the hardening rate under cold-working resembling those of aluminum alloy and niobium, but reduce the frictional resistance between the die and the composite round rod during extrusion or drawing to facilitate the processing.

More specifically, several tens to several hundreds of the composite round rods (3) or (4) composed of Nb (1) and aluminum alloy (2) are bundled and inserted into a pipe of oxygen free copper (5) or cupro-nickel (6) or the like, and this multi-core structured composite material is processed into a long, filamentary form by extrusion, cold drawing, or like means. The product is further cut into plural strands of an adequate length, and several tens to several hundreds of the strands are bundled and inserted again into a pipe of oxygen-free copper (5) or cupro-nickel (6) or the like and processed into a long, filamentary form. Thus a multi-core structured composite linear member having several thousands to several ten thousands strands of aluminum alloy cores is obtained. The resultant linear composite member is further processed through the steps as above-described, to finally provide a linear composite material having several hundred thousands to several ten millions strands of the aluminum alloy cores.

One of the conspicuous features of the process of this invention is that the linear composite article as the final product in which the aluminum alloy cores have a diameter of not greater than about 1$\mu$m and homogeneous composition can be obtained with ease.

In the linearization processing as above, if pure aluminum is used instead of aluminum alloy, the material is too soft to be processed to a diameter not greater than 1$\mu$m. Conversely, if the aluminum alloy is too hard, the linearization processing becomes difficult.

In case an aluminum alloy employed is too hard, an intermediate annealing at a temperature low enough not to cause a diffusion reaction at the Nb-Al interface, eg., at 300-400° C., on halfway the processing.

Thus obtained composite linear material is heat-treated at temperatures between about 700 — about 2,300° C., preferably about 750 — about 2,000° C., to cause a diffusion reaction between the aluminum alloy and niobium, to form filamentary Nb$_3$Al compound.

According to the studies of the present inventors, it is found that, when the heat treatment of above linear composite material is carried out at higher part of above temperature range for a very short period, the linear composite articles still more excelling in critical current density in high magnetic field can be obtained.

This high temperature-short duration heat treatment is conducted for a very short period of not longer than about 10 seconds, preferably not longer than about 5 seconds, at temperatures ranging from about 1,100° C. to about 2,300° C., preferably from about 1400° C. to about 2,000° C. Because the heat treatment should be conducted at such high temperatures for a short time, means suitable for that purpose is employed. In preferred embodiments, for example, the linear composite material can be heated to the desired temperature by direct electrification heating, induction heating, radiation heating or by combinations of these means, followed by immediate cooling. Generally the heating treatment can be conducted by continuously heating and cooling the same, while transferring the linear composite material. This heat treatment is preferably conducted in an inert gaseous atmosphere and/or in liquefied inert gas.

After the above high temperature-short duration heat treatment, if the linear composite material is further subjected to a post-heat treatment at about 600 to about 800° C., its characteristics in high magnetic field can be still more improved.

Generally this post-heat treatment is advantageously conducted for at least an hour, preferably from 20 to 200 hours.

Furthermore, during the above high temperature-short duration heat treatment, if the linear composite material is surrounded by copper or a copper alloy, the copper or copper alloy would be fused, making the material impossible of shape-retension. In that case, it is necessary for the shape-retension, to encase the linear composite material with a high-melting point substance such as niobium, tantalum or vanadium.

By so performing the high temperature-short duration heat treatment to form an ultra fine, filamentary superconducting Nb$_3$Al, it becomes possible to obtain linear composite articles exhibiting excellent superconducting characteristics in high magnetic field or alternating-current magnetic field.

According to the process of the present invention as above, a long, linear composite article of the present invention of the structure in which extremely large number of superfine filamentary Nb$_3$Al of the diameter not greater than 1$\mu$m are embedded in the matrix composed of oxygen-free copper, cupronickel, coppermanganese alloy, or a mixture of the foregoing, is obtained. The composite article and its production process of the present invention have the following advantages and characteristics.

(i) Because the aluminum alloy has an extremely fine diameter of not greater than approximately 1$\mu$m, the diffusion reaction takes place during a low temperature-heat treatment within a short time (In case of an alloy having a diameter of the order at least several tens $\mu$m, a high temperature-heat treatment at 1400-1800° C. is required.) to form filamentary Nb$_3$Al of ultra-fine filament sizes. Thus a wire of high critical current density, an extremely important factor for its practical use, can be obtained.

(ii) Because the filamentary Nb$_3$Al has higher upper critical magnetic field compared with Nb$_3$Sn or V$_3$Ga which are being used as practical high magnetic intensity superconducting materials, it is suited for providing high-magnetic field.

(iii) Because the process of the present invention scarcely requires intermediate annealing and neither requires particularly the provision of diffusion barrier in the wire during its compounding, the production cost is less than that of Nb$_3$Sn or V$_3$Ga wires.

(iv) The composite article of the invention is a wire containing ultra-fine and homogeneous filamentary Nb$_3$Al of the diameter not greater than about $\mu$m as the cores. Because such a ultra-fine multifilamentary wire has a very low alternating current loss, the product can be used also with alternatingcurrent of commercial frequencies.

(v) Because the linear composite article of the invention has a higher critical temperature compared with already commercialized Nb-Ti ultra-fine multifilamentary wire, it allows greater temperature margin when it is used with alternating-current, and is advantageous.

Figure 3A:
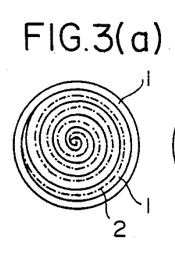
Figure 3B:
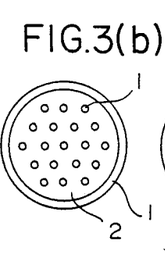
Figure 3C:
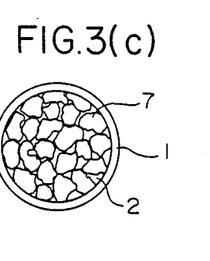

It should be obvious that the present invention is not limited to the above-described process. For example, when large alternating-current loss is not detrimental for the intended usage, as illustrated in FIG. 3, the starting material of the process may be: as in (a), a composite body formed by superposing alternately several tens to several hundreds sheets of niobium (1) foil and aluminum alloy (2) foil, as in (b), a composite body formed by filling a niobium (1) pipe with several hundreds to several ten hundreds strands of niobium (1) fine wire plated with aluminum alloy (2), or as in (c), a composite body formed by infiltrating melted aluminum alloy (2) in a porous sintered body (7) of niobium (1) powder.

According to the present invention, however, the starting materials of the cross sections as illustrated in FIGS. 1 and 2 are particularly preferred.

Furthermore, the aluminum alloy and niobium used in the invention may contain, independently of each other, up to 4 at% of Si or Ge, which is effective for improving Tc and Jc of the superconducting $Nb_3Al$ wire.

Hereinafter the invention will be explained in further details with reference to the working Examples. Needless to say, the invention is in no way limited by the following Examples.

EXAMPLE 1

Rods of circular cross section each 7mm in outer diameter and composed respectively of Al, Al-0.1 at% Cu, Al-2 at% Cu, Al-3 at% Cu, Al-0.5 at% Cu-10 at% Mg, Al-2 at% Cu-0.5 at% Mg, Al-2 at% Cu-0.5 at% Mg-0.1 at% Zn-0.2 at% Li-0.1 at% Ag, and Al-0.5 at% Cu-7 at% Mg-2 at% Zn-1 at% Li-1 at% Ag were separately inserted into a niobium pipe of 14 mm in outer diameter and 7 mm in inner diameter, to form eight types of composite bodies, which were processed into wires of each 1.14 mm in outer diameter by such cold drawing means as grooved rolling, swaging, drawing or the like. 120 Strands each of thus obtained eight types of single-core composite wires were assembled and inserted each into a niobium pipe of 20mm in outer diameter and 14 mm in inner diameter to form composite filaments. Further through similar cold drawing, multi-core composite wires of each 1.14mm outer diameter containing 120 cores were obtained. (Hereinafter this product will be referred to "120-core composite wire". Similar naming will be applied to any drawn products hereinafter appearing.) Therefore, the core portion of this composite wire had the composition identical with that of Al or various aluminum alloys used for the above-specified rods of round cross section.

120 Strands of the 120-core composite wire of the same composition each were assembled and inserted into an oxygen-free copper pipe of 20 mm in outer diameter and 14 mm in inner diameter. Thus formed composite bodies were cold-drawn as before into composite wires of each 120×120-core composite wire of 1.14 mm in outer diameter. Again 120 strands of each type of the composite wire were assembled and each inserted into an oxygen-free copper pipe of 20 mm in outer diameter and 14 mm in inner diameter. Thus obtained composite bodies were cold-drawn as before into each a 120×120×120-core composite wire of 0.3–10 mm in outer diameter. Thus obtained wires were heat-treated at 600–1,000° C. to form filamentary $Nb_3Al$ therein. Superconducting critical temperature Tc and critical current density Jc of each of the multifilamentary products were measured.

The wire with pure aluminum as the core could not be processed as the core could not retain its original form. Those with Al-0.1 at% Cu or Al-3 at% Cu alloys as the core could be processed until the individual core diameter was reduced to 1μm, but when the core diameter was made less, core breakage took place. From those having the cores of Al-2 at% Cu alloy, Al-0.5 at% Cu-10 at% Mg, Al-2 at% Cu-0.5 at% Mg, Al-2 at% Cu-0.5 at% Mg-0.1 at% Zn-0.2 at% Li-0.1 at% Ag, and Al-0.5 at% Cu-7 at% Mg-2 at% Zn-1 at% Li-1 at% Ag alloys, multifilamentary wires of individual core diameter around 0.1μm could be prepared.

Within the heat-treating temperature range of 700–1,000° C., high Tc's of at least 14K were measured. The Tc was strongly dependent on the core diameter, and the high Tc's of at least 14K could not be obtained unless the diameter became no greater than 1μm.

Typical Tc's and Jc's obtained with each of the test samples are shown in Table 1 below. From the result shown in Table 1, it can be understood that the linear composite articles of the present invention exhibit extremely high, practically promising Jc's. Furthermore it became clear that, because a large amount of oxygen-free copper is compounded in the articles, they are electromagnetically highly stable and are optimum for use in large-capacity conductors.

TABLE 1

Typical Tc's and Jc's of $Nb_3Al$ Ultra-fine Multifilamentary Wires With Al—Cu Alloy Core

| Core composition | Core diameter | Heat-treating conditions (°C., hr) | Tc | Jc (14T) A/cm$^2$ |
|---|---|---|---|---|
| (1) | 1 μm | 1000° C., 1 | 14.1K | $5 \times 10^4$ |
| (2) | 0.1 μm | 850° C., 0.5 | 15.6K | $3 \times 10^5$ |
| (3) | 0.1 μm | 700° C., 100 | 15.5K | $2 \times 10^5$ |
| (4) | 1 μm | 800° C., 1 | 14.3K | $8 \times 10^4$ |
| (5) | 0.1 μm | 700° C., 100 | 15.4K | $2 \times 10^5$ |
| (6) | 0.1 μm | 700° C., 1 | 15.3K | $2 \times 10^5$ |
| (7) | 0.1 μm | 700° C., 1 | 15.2K | $2 \times 10^5$ |
| (8) | 0.1 μm | 700° C., 1 | 15.3K | $2 \times 10^5$ |

(Note) Core composition:
(1) Al-0.1 at % Cu, (2) Al-2 at % Cu, (3) Al-2 at % Cu,
(4) Al-3 at % Cu, (5) Al-0.5 at % Cu-10 at % Mg,
(6) Al-2 at % Cu-0.5 at % Mg,
(7) Al-2 at % Cu-0.5 at % Mg-0.1 at % Zn-0.2 at % Li-0.1 at % Ag,
(8) Al-0.5 at % Cu-7 at % Mg-2 at % Zn-1 at % Li-1 at % Ag.

EXAMPLE 2

By the method similar to Example 1, single-core linear composite wires (outer diameter: 1.14 mm) were prepared each with an Al-Cu alloy core of the composition indicated in Table 2 below. 110 Strands each of the same type of the wire were assembled and inserted into a cupro nickel (Cu-20 at% Ni alloy) pipe of 20 mm in outer diameter and 14 mm in inner diameter. Thus formed composite bodies were processed into 110-core composite wire of 1.14 mm outer diameter by cold-drawing. Each same type of wire strands were assembled and inserted into the same cupro-nickel pipe and subjected to the cold drawing similarly to Example 1, and by repeating this compounding — drawing cycles, ultra-fine multifilamentary wires each having 110×110×110 strands of the aluminum alloy core (individual core diameter: 0.03μm) were successfully prepared. With the typical of those wires, Tc's and Jc's were measured by the methods approximately similar to those employed in Example 1, with the results as shown in Table 2. With the ultra-fine multifilamentary wires in which matrix is cupro-nickel of high electrical resistance like the present case, coupling-current between superconducting filaments is intercepted to make the alternating-current loss very low. Hence, the wires can be used for alternating-current of commercial frequencies.

TABLE 2

Typical Tc's and Jc's of Nb$_3$Al Ultra-fine Multifilamentary Wires With Al—Cu—based Alloy Core Compounded with Cupro-nickel

| Core composition | Core diameter | Heat-treating conditions (°C., hr) | | Tc | Jc (14T) A/cm$^2$ |
|---|---|---|---|---|---|
| (1) | 1 μm | 1000° C., | 1 | 13.9K | 4 × 10$^4$ |
| (2) | 0.1 μm | 850° C., | 0.5 | 15.5K | 3 × 10$^5$ |
| (3) | 0.1 μm | 700° C., | 100 | 15.4K | 2 × 10$^5$ |
| (4) | 1 μm | 800° C., | 1 | 14.2K | 8 × 10$^4$ |
| (5) | 0.1 μm | 700° C., | 100 | 15.3K | 2 × 10$^5$ |
| (6) | 0.1 μm | 700° C., | 1 | 15.2K | 2 × 10$^5$ |
| (7) | 0.1 μm | 700° C., | 1 | 15.1K | 2 × 10$^5$ |
| (8) | 0.1 μm | 700° C., | 1 | 15.2K | 2 × 10$^5$ |
| (9) | 0.03 μm | 750° C., | 1.5 | 15.4K | 2 × 10$^5$ |
| (10) | 0.03 μm | 750° C., | 1.5 | 15.3K | 2 × 10$^5$ |

(Note) Core composition:
(1) Al-0.1 at % Cu, (2) Al-2 at % Cu, (3) Al-2 at % Cu,
(4) Al-3 at % Cu, (5) Al-0.5 at % Cu-10 at % Mg,
(6) Al-2 at % Cu-0.5 at % Mg,
(7) Al-2 at % Cu-0.5 at % Mg-0.1 at % Zn-0.2 at % Li-0.1 at % Ag,
(8) Al-0.5 at % Cu-7 at % Mg-2 at % Zn-1 at % Li-1 at % Ag,
(9) Al-2 at % Cu, (10) Al-2 at % Cu-0.5 at % Mg.

EXAMPLE 3

Rods of circular cross section each 6mm in outer diameter and composed respectively of Al, Al-3 at% Mg, Al-6 at% Mg, Al-10 at% Mg and Al-15 at% Mg were separately inserted into a niobium pipe of 12 mm in outer diameter and 6 mm in inner diameter. Thus formed composite bodies were processed into wires of each 1.14 mm in outer diameter by such cold drawing means as grooved rolling, swaging, drawing or the like. 110 Strands each of thus obtained single-core composite wires were assembled and inserted each into a niobium pipe of 20mm in outer diameter and 14 mm in inner diameter to form composite filaments. Further through similar cold drawing, multi-core composite wires of each 1.14mm outer diameter containing 110 cores were obtained. (Hereinafter this product will be referred to as "110-core composite wire"). Therefore, the core portion of this composite wire had the composition identical with that of Al or various Al-Mg alloys used for the above-specified rods of round cross section.

110 Strands of the 110-core composite wire of the same composition each were assembled and inserted into an oxygen-free copper pipe of 20 mm in outer diameter and 14 mm in inner diameter. Thus formed composite bodies were cold-drawn as before into composite wires of each 110×110-core composite wire of 1.14 mm in outer diameter. Again 110 strands of each type of the composite wire were assembled and inserted into an oxygen-free copper pipe of 20 mm in outer diameter and 14 mm in inner diameter. Thus obtained composite bodies were cold-drawn as before into each a 110×110×110-core composite wire of 0.3×10 mm in outer diameter. Thus obtained wires were heat-treated at 600–1,000° C. to form filamentary Nb$_3$Al therein. Superconducting critical temperature Tc and critical current density Jc of each of the multifilamentary products were measured.

The wire with pure aluminum as the core could not be colddrawn as the core was deformed when its core diameter was reduced beyond 5μm. Processing of the wires with Al-3 at% Mg or Al-15 at% Mg alloys as the core was bearly possible until the individual core diameter was reduced to 1μm, but when the core diameter was made less, core breakage took place. From those having the cores of Al-6 at% Mg and Al-10 at% Mg alloys, ultra-fine multifilamentary wires of individual core diameter ranging from 1μm to 0.03μm could be prepared.

Within the heat-treating temperature range of 700–1,000° C., high Tc's of at least 14K were measured. When the heat-treating temperature exceeded 1000° C., the matrix oxygenfree copper fused. The Tc was strongly dependent on the core diameter, and the high Tc's of at least 14K could not be obtained unless the diameter became no greater than 1μm.

The critical temperatures (Tc) and critical current densities (Jc) of typical composite articles obtained from each of those samples were measured, with the results shown in Table 3 below. From the data in the same Table it can be understood that those composite articles possess extremely high, industrially valuable Jc's. Furthermore, because the wires are compounded with a large amount of oxygen-free copper, they are electromagnetically highly stabilized, and are suitable as large-capacity conductors.

TABLE 3

Typical Tc's and Jc's of Nb$_3$Al Ultra-fine Multifilamentary Wires With Al—Mg Alloy Cores

| Core composition | Core diameter | Heat-treating conditions (°C., hr) | | Tc | Jc (14T) A/cm$^2$ |
|---|---|---|---|---|---|
| Al-3 at % Mg | 1 μm | 1000° C., | 1 | 13.9K | 5 × 10$^4$ |
| Al-6 at % Mg | 0.3 μm | 850° C., | 0.5 | 15.6K | 2 × 10$^5$ |
| Al-6 at % Mg | 0.1 μm | 700° C., | 100 | 15.5K | 3 × 10$^5$ |
| Al-10 at % Mg | 0.3 μm | 800° C., | 1 | 15.5K | 2 × 10$^5$ |
| Al-10 at % Mg | 0.1 μm | 700° C., | 100 | 15.4K | 3 × 10$^5$ |
| Al-15 at % Mg | 1 μm | 800° C., | 1 | 13.8K | 4 × 10$^4$ |

EXAMPLE 4

Using rods of circular cross section each 6mm in outer diameter and composed respectively of Al-3 at% Mg, Al-6 at% Mg, Al-10 at% Mg and Al-15 at% Mg, single-core composite wires (1.14 mm in outer diameter) were prepared in the manner similar to Example 3. 110 Strands each of same type single-core composite wire were assembled and inserted each into a cupronickel (Cu-20 at% Ni alloy) pipe of 20mm in outer diameter and 14 mm in inner diameter to form composite materials, which were processed by cold drawing into 110-core composite wires of each 1.14mm outer diameter. By further repeating the compounding into a cupro-nickel pipe and cold-drawing cycle similarly to Example 2, ultra-fine multifilamentary wires each having 110×110×110 strands of the aluminum alloy cores (core diameter: about 0.03μm) were successfully prepared. The wires had the Tc's and Jc's indicated in Table 4. In such ultra-fine multifilamentary wires having cupro-nickel matrix of high electrical resistance, coupled current flowing between superconducting filaments is intercepted to drastically reduce the alternating-current loss. Consequently the wires become useful for alternating current of commercial frequencies.

TABLE 4

Typical Tc's and Jc's of Nb$_3$Al Ultra-fine Multifilamentary Wires With Al—Mg—based Alloy Core Compounded with Cupro-nickel

| Core composition | Core diameter | Heat-treating conditions (°C., hr) | Tc | Jc (14T) A/cm$^2$ |
|---|---|---|---|---|
| Al-3 at % Mg | 1 μm | 1000° C., 1 | 13.8K | 4 × 10$^4$ |
| Al-6 at % Mg | 0.03 μm | 850° C., 0.5 | 15.5K | 2 × 10$^5$ |
| Al-6 at % Mg | 0.1 μm | 700° C., 100 | 15.4K | 3 × 10$^5$ |
| Al-10 at % Mg | 0.03 μm | 800° C., 1 | 15.4K | 2 × 10$^4$ |
| Al-10 at % Mg | 0.1 μm | 700° C., 100 | 15.3K | 3 × 10$^5$ |
| Al-15 at % Mg | 1 μm | 800° C., 1 | 13.7K | 4 × 10$^4$ |

EXAMPLE 5

Using rods of circular cross section each 6mm in outer diameter and composed respectively of Al-3 at% Zn, Al-5 at% Zn, Al-7 at% Zn, Al-10 at% Zn, Al-3 at% Li, Al-6 at% Li, Al-10 at% Li, Al-15 at% Li, Al-3 at% Ag, Al-5 at% Ag, Al-7 at% Ag, and Al-10 at% Ag alloy, the composite-processing cycles were repeated similarly to Example 3 Thus composite wires each having 110×110×110 strands of respective aluminum alloy cores were prepared. When Al-3 at% Zn, Al-10 at% Zn, Al-3 at% Li, Al-15 at% Li, Al-3 at% Ag and Al-10 at% Ag alloys were used as the core, however, the composite wires showed breakages during the cold-drawing after the core diameter was reduced to less than 1μm, and no further drawing was possible. On the other hand, when Al-5 at% Zn, Al-7 at% Zn, Al-5 at% Li, Al-6 at% Li, Al-10 at% Li, Al-5 at% Ag, and Al-7 At% Ag alloys were used as the core material, cold-drawing was possible until the core diameter became about 0.03μm.

When the wires were heat-treated at temperatures ranging from 700–1,000° C., high Tc's of at least 14K were obtained. When the heat-treating temperature exceeded 1,000° C., the oxygen-free copper as the matrix fused, and the Tc was strongly dependent on the core diameter, high Tc's of at least 14K being obtainable only with the core diameters reduced to no more than 1μm, similarly to the phenomena observed with Al-Mg alloy cores.

Typical Tc's and Jc's obtained in each of the tests are shown in Table 5 below. From the results shown in Table 5, it can be understood that the wires had very high and industrially useful Jc's. Furthermore, it is same to the case of the products obtained in Example 5, that those wires are suited for use as large-capacity conductors, because they are electromagnetically highly stabilized due to the presence of a large amount of oxygen-free copper compounded therein.

TABLE 5

Typical Tc's and Jc's of Nb$_3$Al Ultra-fine Multifilamentary Wires With Al—Cu, Al—Li, and Al—Ag Alloy Cores

| Core composition | Core diameter | Heat-treating conditions (°C., hr) | Tc | Jc (14T) A/cm$^2$ |
|---|---|---|---|---|
| Al-3 at % Zn | 1 μm | 1000° C., 1 | 14.0K | 4 × 10$^4$ |
| Al-5 at % Zn | 0.1 μm | 850° C., 0.5 | 15.5K | 2 × 10$^5$ |
| Al-7 at % Zn | 0.1 μm | 700° C., 100 | 15.4K | 2 × 10$^5$ |
| Al-10 at % Zn | 1 μm | 1000° C., 1 | 13.8K | 8 × 10$^4$ |
| Al-3 at % Li | 1 μm | 1000° C., 1 | 13.9K | 3 × 10$^4$ |
| Al-6 at % Li | 0.1 μm | 800° C., 1 | 16.9K | 4 × 10$^5$ |
| Al-10 at % Li | 0.1 μm | 700° C., 100 | 16.2K | 4 × 10$^5$ |
| Al-15 at % LI | 1 μm | 800° C., 1 | 14.0K | 9 × 10$^4$ |
| Al-3 at % Ag | 1 μm | 1000° C., 1 | 13.9K | 7 × 10$^4$ |
| Al-5 at % Ag | 0.1 μm | 850° C., 0.5 | 16.6K | 3 × 10$^5$ |
| Al-7 at % Ag | 0.1 μm | 800° C., 1 | 16.3K | 2 × 10$^5$ |
| Al-10 at % Ag | 1 μm | 1000° C., 1 | 14.0K | 1 × 10$^4$ |

EXAMPLE 6

The most important point in the preparation of Nb-Al composite articles having the ultra-fine structure like the product of the invention through the compounding processing is, that the aluminum alloy should possess the hardening characteristics resembling those of niobium under the processing. Examination of hardening characteristics of aluminum-based Al-Mg-Zn-Li-Ag alloys revealed that when added amounts of each of the elements are small, the hardening characteristics are determined by the total amount of addition of those other elements to aluminum. Again, when such total amount of addition of other elements exceeds 4 at%, the hardening characteristics of the alloy vary considerably depending on the type of the element of the greatest amount added. A tendency was observed that when 2–4 types of elements were added, the alloys become harder than the case of single-element addition.

Rods of circular cross sections each composed of Al-6 at% Mg-1 at% Zn-1 at% Li-1 at% Ag, Al-1 at% Mg-4 at% Zn-1 at% Li-1 at% Ag, Al-1 at% Mg-1 at% Zn-6 at% Li-1 at% Ag, and Al-1 at% Mg-1 at% Zn-1 at% Li-4 at% Ag alloy were separately used as the core, and through the repeated compounding-drawing cycles similarly to Example 3, composite wires each having 110×110×110 strands of aluminum alloy core (core diameter: 0.1μm) were prepared. When those wires were given a heat-treatment at 800° C. × 1 hour, Tc's and Jc's as shown in Table 6 below were obtained.

TABLE 6

Tc's and Jc's of Nb$_3$Al Multifilamentary Wires with Various Five-components Aluminum Alloys

| Composition of core material | Tc | Jc (14T) A/cm$^2$ |
|---|---|---|
| Al-6 at % Mg-1 at % Zn-1 at % Li-1 at % Ag | 15.7K | 2 × 10$^5$ |
| Al-1 at % Mg-4 at % Zn-1 at % Li-1 at % Ag | 16.0K | 3 × 10$^5$ |
| Al-1 at % Mg-1 at % Zn-6 at % Li-1 at % Ag | 16.1K | 3 × 10$^5$ |
| Al-1 at % Mg-1 at % Zn-1 at % Li-4 at % Ag | 16.0K | 2 × 10$^5$ |

EXAMPLE 7

Using each a rod of circular cross section 6mm in outer diameter composed respectively of Al-2 at% Cu-2 at% Ge, Al-2 at% Cu-4 at% Ge, Al-2 at% Cu-2 at% S, Al-2 at% Cu-4 at% Si and Al-2 at% Ge-2 at% Si alloy, and pipes of each 14mm in outer diameter and 7mm in inner diameter composed respectively of Nb-3 at% Ge and Nb-3 at% Si alloy, composite wires each having 120×120×120 strands of aluminum alloy core (core diameter: 0.1μm) were prepared by the process similar to Example 3. When the composite wires were heat-treated at 800° C. for 5 hours, high Tc's and Jc's were obtained as shown in Table 7 below.

TABLE 7

Typical Tc's and Jc's of $Nb_3Al$ Multifilamentary Wires to Which Si and Ge Are Added

| Composition of Al alloy | Composition of Nb alloy | Tc | Jc (14T) A/cm² |
|---|---|---|---|
| Al-2 at % Cu-2 at % Ge | Nb-3 at % Ge | 17.5K | 4 × 10⁵ |
| Al-2 at % Cu-4 at % Ge | | 18.0K | 5 × 10⁵ |
| Al-2 at % Cu-2 at % Si | Nb-3 at % Si | 17.0K | 3 × 10⁵ |
| Al-2 at % Cu-4 at % Si | | 17.5K | 3 × 10⁵ |
| Al-2 at % Cu-2 at % Ge-2 at % Si | Nb-3 at % Ge | 17.8K | 5 × 10⁵ |
| Al-2 at % Cu-2 at % Ge-2 at % Si | Nb-3 at % Si | 17.6K | 4 × 10⁵ |

Example 8

Using each a rod of circular cross section 6mm in outer diameter composed respectively of Al-6 at% Mg-2 at% Ge, Al-6 at% Mg-4 at% Ge, Al-6 at% Mg-2 at% Si, Al-6 at% Mg-4 at% Si and Al-6 at% Mg-2 at% Ge-2 at% Si alloy, and pipes of each 12mm in outer diameter and 6mm in inner diameter composed respectively of Nb-3 at% Ge and Nb-3 at% Si alloy, composite wires each having 110×110×110 strands of aluminum alloy core (core diameter: 0.1μm) were prepared by the process similar to Example 3. When the composite wires were heat-treated at 800° C. for an hour, high Tc's and Jc's were obtained as shown in Table 8 below. Furthermore, when 5 at% or more of Si and Ge in total was added to the aluminum alloy or niobium, workability of the system deteriorated and the ultrafine multifilamentary wire could not be prepared.

TABLE 8

Typical Tc's and Jc's of $Nb_3Al$ Multifilamentary Wires to Which Si and Ge Are Added

| Composition of Al alloy | Composition of Nb alloy | Tc | Jc (14T) A/cm² |
|---|---|---|---|
| Al-6 at % Mg-2 at % Ge | Nb-3 at % Ge | 18.0K | 4 × 10⁵ |
| Al-6 at % Mg-4 at % Ge | Nb-3 at % Ge | 18.5K | 5 × 10⁵ |
| Al-6 at % Mg-2 at % Si | Nb-3 at % Si | 17.1K | 3 × 10⁵ |
| Al-6 at % Mg-4 at % Si | Nb-3 at % Si | 17.8K | 3 × 10⁵ |
| Al-6 at % Mg-2 at % Si-2 at % Ge | Nb-3 at % Ge | 18.3K | 5 × 10⁵ |
| Al-6 at % Mg-2 at % Si-2 at % Ge | Nb-3 at % Si | 18.0K | 4 × 10⁵ |

EXAMPLE 9

When the amounts of other components added to aluminum to form the alloy were relatively small, like Al-0.1 at% Cu, Al-2.5 at% Mg, Al-2.5 at% Zn, Al-2.5 at% Li, Al-2.5 at% Ag, Al-1 at% Ag-0.7 at% Ge, Al-1 at% Mg-0.7 at% Si, their Vickers hardness could be increased from about 50 to 100, when they were subjected to solution treatment at 400–550° C. for at least an hour and thereafter to quenching in water and tempering at room temperature to 200° C. for at least an hour. Thus their hardness became equivalent to that of Nb, and the alloys as the core could be processed to the core diameter of 0.1μm.

TABLE 9

Typical Tc's and Jc's of $Nb_3Al$ Ultra-fine Multifilamentary Wires Using Hardened Aluminum Alloy by Tempering

| Composition of core alloy | Tc | Jc (14T) A/cm² |
|---|---|---|
| Al-0.1 at % Cu | 15.9K | 3 × 10⁵ |
| Al-2.5 at % Mg | 15.8K | 2 × 10⁵ |
| Al-2.5 at % Zn | 15.6K | 2 × 10⁵ |
| Al-2.5 at % Li | 16.8K | 4 × 10⁵ |
| Al-1 at % Ag-0.7 at % Ge | 16.3K | 3 × 10⁵ |
| Al-1 at % Mg-0.7 at % Si | 16.0K | 2 × 10⁵ |

EXAMPLE 10

The production steps of Example 3 were repeated except that a rod of circular cross section composed of Al-7 at% Mg alloy was used as the core. Thus a linear composite article having filamentary $Nb_3Al$ cores of each 0.1μm diameter was obtained. The outer diameter of this article was 0.7 mm. When a tensile strain was exerted on this article and Ic was measured, no occurrence of crack was observed in the $Nb_3Al$ filaments up to the strain of 1.3–1.5%, and deterioration in superconducting characteristics was little. This value shows very excellent property of the product of the invention, compared with the other commercial superconducting $Nb_3Sn$ or $V_3Ga$ wires showing cracks in the superconducting filaments under a strain of around about 0.6% and exhibiting rapid deterioration in their superconducting characteristics. Thus the composite articles of the present invention possess excellent resistance to tensile strain, which is a property very advantageous for industrial use.

EXAMPLE 11

A rod of circular cross section 6 mm in outer diameter and composed of Al-6 at% Mg was inserted into a niobium pipe of 12 mm in outer diameter and 6 mm in inner diameter to form a composite body, which was processed into wire of 1.14 mm in outer diameter by such cold drawing means as grooved rolling, swaging, drawing or the like. 110 Strands of this singlecore composite wire were assembled and inserted into a niobium pipe of 20 mm in outer diameter and 14 mm in inner diameter to form a multi-core composite body, which was then processed into a 110-core composite wire of 1.14 mm in outer diameter by cold drawing. Twice repeating the steps of assembling 110 strands of this 110-core composite wire, inserting the assemblage into a niobium pipe, and drawing the resultant multi-core composite body, a 110×110×110core composite wire of 0.3–10 mm in outer diameter was obtained. This wire was heat-treated by direct electrification in liquid nitrogen, while being moved to be subjected to a heating at 1–100 kW/cm³ and at least about 1400° C. for 0.01–10 seconds and thereafter cooled immediately, to form $Nb_3Al$ filaments in the wire. Thus plural wires in which the cores have each a diameter of not more than 0.5μm were prepared. For each of the wires superconducting critical temperature $T_c$ and critical current density $J_c$ were measured. The results are shown in Table 1.

TABLE 10

| Core diameter | Heat-treating conditions | Post-heat treatment | $T_c$ | $J_c$ (10T) |
|---|---|---|---|---|
| 0.5 μm | 10 kW × 10 sec | — | 15.7K | 3 × 10⁴ A/cm² |
| 0.5 μm | 10 kW × 10 sec | 700° C. × 24 hr | 16.7K | 5 × 10⁴ A/cm² |
| 0.3 μm | 10 kW × 10 sec | — | 17.3K | 2 × 10⁵ A/cm² |
| 0.3 μm | 10 kW × 10 sec | 700° C. × 24 hr | 18.5K | 3 × 10⁵ A/cm² |

TABLE 10-continued

| Core diameter | Heat-treating conditions | Post-heat treatment | $T_c$ | $J_c$ (10T) |
|---|---|---|---|---|
| 0.1 μm | 50 kW × 2 sec | — | 17.4K | $2 \times 10^5$ A/cm$^2$ |
| 0.1 μm | 50 kW × 2 sec | 600° C. × 48 hr | 17.7K | $3 \times 10^5$ A/cm$^2$ |
| 0.1 μm | 50 kW × 2 sec | 700° C. × 48 hr | 18.4K | $4 \times 10^5$ A/cm$^2$ |
| 0.1 μm | 50 kW × 2 sec | 850° C. × 48 hr | 17.1K | $1 \times 10^5$ A/cm$^2$ |
| 0.1 μm | 50 kW × 10 sec | — | 11.4K | $1 \times 10^3$ A/cm$^2$ |
| 0.1 μm | 50 kW × 10 sec | 700° C. × 48 hr | 12.4K | $2 \times 10^3$ A/cm$^2$ |
| 0.1 μm | 50 kW × 0.5 sec | — | 14.8K | $1 \times 10^4$ A/cm$^2$ |
| 0.1 μm | 50 kW × 0.5 sec | 700° C. × 48 hr | 15.4K | $2 \times 10^4$ A/cm$^2$ |
| 0.05 μm | 20 kW × 5 sec | 700° C. × 48 hr | 18.5K | $5 \times 10^5$ A/cm$^2$ |

When the core diameter was 0.3μm or less, a high $T_c$ of at least 17K was obtained when the total energy applied at the heating time was in the order of 100 KJ/cm$^3$. When the wires were given a post-heat treatment of several days at around 700° C., they exhibited a still higher $T_c$ of at least 18K. $J_c$ depended on the core diameter, and high $J_c$ of at least $10^5$A/cm$^2$ (4.2K, 10T) was not obtained unless the core diameter was reduced to 0.3μm or less. The samples having $T_c > 18$K showed $H_{c2}$ (4.2K) > 30T).

Those wires possessed extremely high superconducting characteristics, and when they were copper-plated after the post-heat treatment, they exhibited very high electromagnetic stability.

EXAMPLE 12

The rod of Al-6 at% Mg used in Example 11 was replaced in each run by a rod of circular cross section having the composition of, respectively, Al-3 at% Mg, Al-10 at% Mg, Al-15 at% Mg, Al-5 at% Zn, Al-10 at% zn, Al-5 at% Li, Al-10 at% Li, Al-4 at% Ag, Al-8 at% Ag, Al-2 at% Cu, Al-5 at% Cu, Al-5 at% Mg-5 at% Zn, Al-5 at% Zn-5 at% Li, Al-5 at% Ag-2 at% Cu, and Al-3 at% Ag-2 at% Ge, and ultra-fine multi-core wires with the core diameter not greater than 0.5μm, of the structure that alminium alloy filaments were inserted in niobium matrix were prepared by the method similar to Example 11. The wires were heat-treated by direct electrification for a very short period of not longer than 10 seconds. When the wires were further post-heat-treated at 700° C., all of them had $T_c$ of at least 17K, $H_{c2}$ of at least 30T, and $J_c$ (4.2K, 10T) of at least $1 \times 10^5$A/cm$^2$

EXAMPLE 13

A rod of circular cross section 6 mm in outer diameter and composed of al-6 at% Mg was inserted into a niobium pipe of 12 mm in outer dismeter and 6 mm in inner diameter to form a composite body, which was processed into wire of 1.14 mm in outer diameter by such cold drawing means as grooved rolling, swaging, drawing or the like. 110 Strands of this single-core composite wire were assembled and inserted into a tantalum pipe of 20 mm in outer diameter and 14 mm in inner diameter to form a multi-core composite body, which was then processed into a 110-core composite wire of 1.14 mm in outer diameter by cold drawing. Twice repeating the steps of assembling 110 strands of this 110-core wire, inserting the assemblage into a tantalum pipe, and drawing the resultant multi-core composite body, a 110×110×110-core composite wire of 0.3–10 mm in outer diameter was obtained. This wire having a core diameter of not greater than 0.5μm was heat-treated by direct electrification in liquid nitrogen, while being moved to be subjected to a heating for 0.2 second and thereafter cooled immediately, to form Nb$_3$Al filaments in the wire.

After post-heat treating them at 700° C., their superconducting critical temperature $T_c$ and critical current density $J_c$ were measured. In this Example also the results were approximately same with those of Example 11 in which niobium pipes were used. Again, when the tantalum pipes were replaced by vanadium pipes, the superconducting characteristics of the resultant wires remained almost unchanged.

EXAMPLE 14

Aluminium powder and niobium powder were mixed and filled in a niobium pipe of 30 mm in outer diameter and 20 mm in inner diameter, and was processed into wire of 0.3 mm in outer diameter by such cold drawing means as grooved rolling, swaging, drawing or the like. Similarly to Example 11, this wire was directly electrified in liquid nitrogen, and then heat-treated for 0.2 second while being moved, followed by immediate cooling to form Nb$_3$Al filaments in the wire. After subsequent postheat treatment at 700° C., their superconducting critical temperature $T_c$ and critical current density $J_c$ were measured. In this Example also the results were about same with those of Example 11. Again, when the aluminium powder was replaced by Al-3 at% Mg, Al-2 at% Mg-1 at% Si or Al-3 at% Ag powder, approximately the same level of superconducting characteristics were obtained.

EXAMPLE 15

A 10μm-thick aluminium foil and a 40μm-thick niobium foil were superposed and wound together, and filled in a niobium pipe of 30 mm in outer diameter and 20 mm in inner diameter. So formed composite body was processed into a wire of 0.3 mm in outer diameter, by such cold drawing means as grooved rolling, swaging, drawing or the like. This wire was directly electrified in liquid nitrogen similarly to Example 11, to be heat-treated while being moved, to receive 0.2 second's heating, and cooled immediately. Thus Nb$_3$Al filaments were formed in the wire. After subsequent post-heat treatment at 700° C., superconducting critical temperature $T_c$ and critical current density $J_c$ of the wire were measured. In this Example also the results were about the same with those of Example 11. Again, when the aluminium foil was replaced by Al-3 at% Mg or Al-3 at% Ag foil, approximately the same level of superconducting characteristics were obtained.

EXAMPLE 16

A porous body obtained by pressing niobium powder and sintering the same in vacuum at 2,200° C. was infiltrated with molten aluminium. This composite body was filled in a niobium pipe of 30 mm in outer diameter and 20 mm in inner diameter, and processed into a wire of 0.3 mm in outer diameter, by such cold drawing means as grooved rolling, swaging, drawing or the like. This wire was directly electrified in liquid nitrogen similarly to Example 11, to be heat-treated while being moved, to receive 0.2 second's heating and cooled immediately. Thus Nb$_3$Al filaments were formed in the wire.

After subsequent post-heat-treatment at 700° C., superconducting critical temperature $T_c$ and critical current density $J_c$ of the wire were measured. In this Example also the results were about same with those of Example 11. Again, when the molten aluminium was replaced by molten Al-3 at% Mg, Al-3 at% Ag, or Al-3 at% Ag-2 at% Ge alloy, approximately the same level of superconducting characteristics were obtained.

EXAMPLE 17

(Measurement of maximum allowable strain)

Example 1 was repeated except that a rod of circular cross section of 7 mm in outer diameter and composed of Al-5 at% Mg alloy was used, to form a composite wire. This composite wire was heat-treated at 750° C. for 20 hours, and its $J_c$ was measured under tension in a magnetic field of 7T at 4.2K. Under a tensile strain of 0.5%, $J_c$ of this wire showed a decreased by 4%. This is far lower rate of decrease, compared with the heavy decrease by about 15% shown by Nb$_3$Sn ultra-fine, multi-core wire under the same tensile strain. When still higher strain was applied, the maximum allowable strain, at which a filaments of superconducting compound break and can no more be used, was as high as 1.2 to 2.0% with this Nb$_3$Al ultra-fine, multi-core wire, while that of Nb$_3$Sn ultra-fine, multicore wire is around 0.5 to 0.8%. These little $J_c$ decrease under tensile strain and large maximum allowable strain indicate that, when the composite articles of the present invention are used in superconducting magnet, there is less necessity of considering the influence of electromagnetic power, viz., designing of the magnet is easier, and furthermore because handling of the wires also is easier, the practical value of the present invention is extremely high.

We claim:

1. A long, linear composite article which is characterized in that a large number of composite filaments are present as spaced from one another in a continuous layer composed of copper, a copper alloy, niobium, tantalum or vanadium, each of said composite filaments having a structure that at least one strand of a linear body is surrounded by an aluminum alloy or niobium, said linear body being composed substantially of extremely fine, filamentary superconducting Nb$_3$Al compound having an average diameter of from about 0.03 μm to about 1μm.

2. The linear composite article of claim 1, in which the aluminum alloy contains at least one metal selected from the group consisting of Cu, Mg, Zn, Li and Ag.

3. The linear composite article of claim 1, in which the continuous layer is composed of at least one member selected from the group consisting of oxygen-free copper, cupro-nickel, copper-manganese alloy, niobium, tantalum and vanadium.

4. The linear composite article of claim 1, in which the continuous layer is composed of at least one member elected from the group consisting of oxygen-free copper, cupro-nickel and copper-manganese alloy.

5. The linear composite article of claim 1, in which the linear body composed substantially of Nb$_3$Al compound has an average diameter of from about 0.05μm to about 0.5μm.

6. The linear composite article of claim 1, in which the aluminum alloy contains from about 0.1 to about 15 atomic percent of at least one metal selected from the group consisting of Mg, Zn, Li and Ag.

7. The linear composite article of claim 1, in which the aluminum alloy contains from about 2 to about 15 atomic percent of at least one metal selected from the group consisting of Mg, Zn, Li and Ag.

8. The linear composite article of claim 1, in which the aluminum alloy contains from about 3 to about 10 atomic percent of at least one metal selected from the group consisting of Mg, Zn, Li and Ag.

9. The linear composite article of claim 1, in which the aluminum alloy contains from about 0.5 to about 3 atomic percent of Cu.

10. The linear composite article of claim 1, in which the aluminum alloy contains from about 1 to about 2 atomic percent of Cu.

11. The linear composite article of claim 1, in which the cross section of the Nb$_3$Al compound-containing linear body at a right angle to its axial direction is substantially circular.

12. The linear composite article of claim 1, in which the cross section of the composite filament at a right angle to its lengthwise direction is substantially circular.

13. The linear composite article of claim 1, in which a large number of the composite filament are present in the continuous layer composed substantially of at least one member selected from the group consisting of oxygen-free copper, cupro-nickel, copper-manganese alloy, niobium, tantalum and vanadium, not substantially contacting with one another.

14. The linear composite article of claim 1, in which the continuous layer is composed substantially of oxygen-free copper and/or cupro-nickel.

15. The linear composite article of claim 1, which contains an assembly of from about 100,000 to about 10,000,000 strands of said composite filaments.

16. The linear composite article of claim 1, which has an average diameter of from about 0.2mm to about 5 mm.

17. The linear composite article of claim 1, in which the aluminum alloy further contains not more than 4 atomic percent of Si and/or Ge.

18. The linear composite article of claim 1, in which the niobium contains not more than 4 atomic percent of Si and/or Ge.

* * * * *

UNITED STATES PATENT AND TRADEMARK OFFICE
CERTIFICATE OF CORRECTION

PATENT NO. : 4,917,965
DATED : April 17, 1990
INVENTOR(S) : KIYOSHI INOUE ET AL.

It is certified that error appears in the above-identified patent and that said Letters Patent is hereby corrected as shown below:

COLUMN 5

Line 47, "A-Al," should read --Ag-Al,--.

COLUMN 8

Line 59, "about µm" should read --about 1µm--.

COLUMN 11

Line 59, "0.3X10mm" should read --0.3-10mm--.

COLUMN 20

Line 6, "elected" should read --selected--.

Signed and Sealed this

Twenty-eighth Day of January, 1992

Attest:

HARRY F. MANBECK, JR.

*Attesting Officer*         *Commissioner of Patents and Trademarks*